(12) United States Patent
Yamamoto et al.

(10) Patent No.: US 12,379,750 B2
(45) Date of Patent: Aug. 5, 2025

(54) ELECTRONIC DEVICE

(71) Applicant: Panasonic Intellectual Property Management Co., Ltd., Osaka (JP)

(72) Inventors: Kyota Yamamoto, Osaka (JP); Shintarou Tanaka, Osaka (JP); Junichi Hasegawa, Osaka (JP); Hiroki Kamezaki, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 197 days.

(21) Appl. No.: 18/231,273

(22) Filed: Aug. 8, 2023

(65) Prior Publication Data

US 2023/0376082 A1    Nov. 23, 2023

Related U.S. Application Data

(63) Continuation of application No. PCT/JP2022/002318, filed on Jan. 24, 2022.

(30) Foreign Application Priority Data

Feb. 26, 2021 (JP) ................. 2021-029438

(51) Int. Cl.
G06F 1/16 (2006.01)

(52) U.S. Cl.
CPC .......... G06F 1/1681 (2013.01); G06F 1/1616 (2013.01); G06F 1/1679 (2013.01)

(58) Field of Classification Search
CPC ...... G06F 1/1616; G06F 1/166; G06F 1/1679; G06F 1/1681
See application file for complete search history.

(56) References Cited

U.S. PATENT DOCUMENTS 5,818,688 A * 10/1998 Gluskoter ............... G06F 1/166
                                                        248/118.1
8,976,524 B2 * 3/2015 Wang .................... G06F 1/1656
                                                        361/679.48

(Continued)

FOREIGN PATENT DOCUMENTS

| JP | S62-089023 U | 6/1987 |
| JP | 2007-163951 A | 6/2007 |
| JP | 2014-156890 A | 8/2014 |

OTHER PUBLICATIONS

International Search Report for corresponding Application No. PCT/JP2022/002318, mailed Mar. 22, 2022.

*Primary Examiner* — Anthony Q Edwards
(74) *Attorney, Agent, or Firm* — Renner, Otto, Boisselle & Sklar, LLP

(57) ABSTRACT

An electronic device includes a first housing including a display, a second housing including an operation unit, and a rotation unit that rotates the first housing relative to the second housing. The second housing includes a rotation regulation portion that protrudes from a bottom face of the second housing and regulates rotation of the first housing. The rotation regulation portion includes an elastic member configured to rotate back and forth between a first mode and a second mode with different states of protrusion from a bottom face of the second housing, and contactable with the first housing. The rotation regulation portion, in the first mode, regulate rotation of the first housing in a first rotation range, and in the second mode, regulate rotation of the first housing in a second rotation range where the first housing is rotated to a greater extent than in the first rotation range.

7 Claims, 5 Drawing Sheets

(56) References Cited

U.S. PATENT DOCUMENTS

| | | | | |
|---|---|---|---|---|
| 9,354,669 B2* | 5/2016 | Chen | ............... | G06F 1/1618 |
| 9,983,638 B2* | 5/2018 | Chen | ............... | G06F 1/1616 |
| 10,429,885 B1* | 10/2019 | Shaw | ............... | G06F 1/166 |
| 11,360,522 B2* | 6/2022 | Ho | ............... | G06F 1/1681 |
| 2004/0264118 A1* | 12/2004 | Karidis | ............... | G06F 1/1683 |
| | | | | 361/679.55 |
| 2009/0302175 A1* | 12/2009 | Torii | ............... | F16M 11/10 |
| | | | | 248/122.1 |
| 2014/0293519 A1* | 10/2014 | Wang | ............... | G06F 1/1681 |
| | | | | 361/679.01 |
| 2015/0227168 A1* | 8/2015 | Nakamura | ............... | G06F 1/166 |
| | | | | 361/679.55 |
| 2017/0220066 A1* | 8/2017 | Ohishi | ............... | G06F 1/1681 |
| 2021/0089077 A1* | 3/2021 | Wang | ............... | G06F 1/3287 |
| 2022/0197348 A1* | 6/2022 | Shin | ............... | G06F 1/166 |

* cited by examiner

ELECTRONIC DEVICE

BACKGROUND

1. Technical Field

The present disclosure relates to an electronic device configured to open and close a housing on a display side such as a display with respect to a housing on an operation unit side such as a keyboard.

2. Description of the Related Art

In an electronic device such as a personal computer, a hinge stopper structure is often adopted for rotation regulation when a housing on a display side such as an LCD is opened with respect to a housing on a keyboard side (see, for example, Patent Literature (PTL) 1).
PTL 1 is Unexamined Japanese Utility Model Publication No. S62-89023.

SUMMARY

In recent years, a so-called drop hinge has been adopted as a hinge structure to reduce the thickness of an electronic device and to achieve a large view of an LCD when the LCD is opened. In such a structure, the LCD can be opened to such an extent that a part of the housing on the display side gets under the housing on the keyboard side. In such a case, if a hinge stopper structure is adopted to perform the rotation regulation when the LCD is opened, the structure will become more complicated and costlier.

On the other hand, when there is no stopper for rotation regulation, there is a problem in that the housing on the display side and the housing on the keyboard side come into direct contact with each other and are damaged.

Therefore, in order to solve the above problem, an object of the present disclosure is to provide an electronic device in which the rotation regulation of the housing can be performed by a portion other than the hinge, and the structure can be simplified and the component cost can be reduced by eliminating the hinge stopper structure.

In order to achieve the object, according to one aspect of the present disclosure, an electronic device is provided including a first housing including a display, a second housing including an operation unit, and a rotation unit configured to connect the first housing to the second housing, and rotate the first housing relative to the second housing. The second housing includes a rotation regulation portion that protrudes from a bottom face of the second housing and is configured to regulate rotation of the first housing with respect to the second housing. The rotation regulation portion includes an elastic member configured to rotate back and forth between a first mode and a second mode with different states of protrusion from a bottom face of the second housing, the elastic member being contactable with the first housing, and the rotation regulation portion is configured to, in the first mode, regulate rotation of the first housing with respect to the second housing in a first rotation range, and in the second mode, regulate rotation of the first housing with respect to the second housing in a second rotation range where the first housing is rotated with respect to the second housing to a greater extent than in the first rotation range.

According to the above aspect of the present disclosure, the rotation regulation of the first housing can be performed by a portion other than the hinge, that is, the elastic member protruding from the bottom face of the second housing, and the structure can be simplified and the component cost can be reduced by eliminating the hinge stopper structure. In addition, the rotation regulation of first housing can be performed by the elastic member coming into contact with the first housing, damage due to interference between components can be prevented, and durability can be improved.

DETAILED DESCRIPTION

Figure 1:
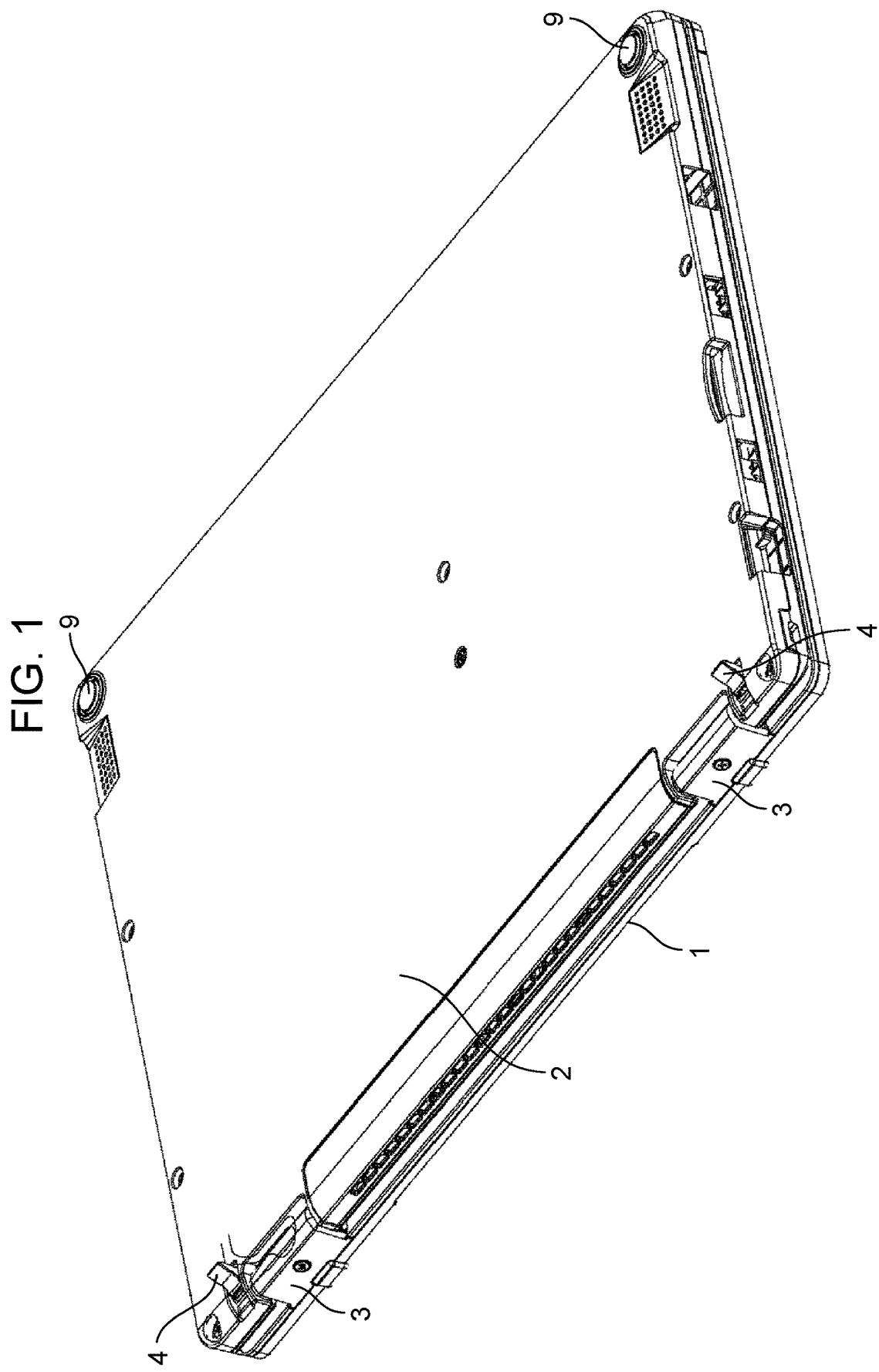
FIG. 1 is a perspective view of an entire personal computer that is an example of an electronic device according to an exemplary embodiment of the present disclosure, as viewed from a back surface side.

Hereinafter, a first exemplary embodiment of the present disclosure will be described in detail with reference to the drawings.

In an electronic device according to the first exemplary embodiment of the present disclosure, a rubber foot member disposed in a housing on a keyboard side is provided with a rotation regulation structure of the housing in addition to original functions of preventing the housing from being rubbed, preventing slippage, and adjusting an installation angle of the housing.

As illustrated in FIGS. 1 to 5, an electronic device according to the first exemplary embodiment of the present disclosure includes first housing 1, second housing 2, rotation unit 3, and foot member 4 as an example of a rotation regulation portion.

First housing 1 is a housing of substantially rectangular box-shape on a side having display 1a that is a display such as an LCD.

Second housing 2 is a housing of a substantially rectangular box-shape on a side having operation unit 2g such as a keyboard. Housing recess 2a capable of partially housing foot member 4 is correspondingly provided near both ends in the width direction of the bottom face of second housing 2 along the rotation axis direction of a hinge that is rotation unit 3 described later. At the bottom of each housing recess 2a, first raised portion 2c, click feeling recess 2b, and second raised portion 2d, which will be described later, are disposed adjacent to each other in a direction orthogonal to the rotation axis of the hinge for positioning foot member 4.

Rotation unit 3 is a hinge configured to connect first housing 1 and second housing 2, and allow first housing 1 to be relatively rotatable with respective to second housing 2.

As an example, the rotation regulation portion includes foot member 4 formed of an elastic member, for example, rubber for slippage prevention, and is disposed correspondingly in housing recess 2a near both ends in the width direction of the bottom face of second housing 2 along the rotation axis direction of the hinge of rotation unit 3. Each foot member 4 is formed of a claw member having a concavo-convex shape on the outer periphery of a substantially triangular plate, and a portion protruding from housing recess 2a comes into contact with an end of first housing 1 on the rotation unit side to regulate the rotation of first housing 1. An apex corner portion of each triangular foot member 4 is contact portion 4a that comes into contact with a surface of a desk when an electronic device is placed on the desk or the like, and has functions of preventing first housing 1 from being rubbed, preventing slippage, and adjusting an angle when first housing 1 is installed. Each foot member 4 has rotation shaft portion 4b at one corner of the triangular base, and is supported rotatable back and forth about rotation shaft 6 with respect to housing recess 2a of second housing 2 between closed position A and opened position B. Rotation shaft 6 is supported by second housing 2. The other corner of each foot member 4 has first protrusion 4c for rotation regulation, the protrusion having functions of preventing first housing 1 from being rubbed, preventing slippage, and adjusting an angle when first housing 1 is installed. One corner side of each foot member 4 functions as second protrusion 4e, and rotation regulation recess 4d in a curved shape is provided on an outer surface of an intermediate portion of an oblique side of second protrusion 4e. As described above, foot member 4 is configured such that rotation shaft portion 4b and first protrusion 4c protrude outward from the respective corners with respect to second protrusion 4e, and foot member 4 looks like a substantially T-shape.

Each foot member 4 is rotatable back and forth with respect to housing recess 2a of second housing 2 between the first mode, for example, closed position A and the second mode, for example, opened position B. Closed position A and opened position B are different from each other in the state of protrusion of foot member 4 from housing recess 2a on the bottom face of second housing 2. For example, in a state where foot member 4 is located at opened position B, the protrusion dimension of second protrusion 4e is larger than the protrusion dimension of first protrusion 4c from housing recess 2a. With this configuration, the rotation regulation can be performed for first housing 1 by opening first housing 1 nearly 180 degrees with respect to second housing 2.

Figure 2:
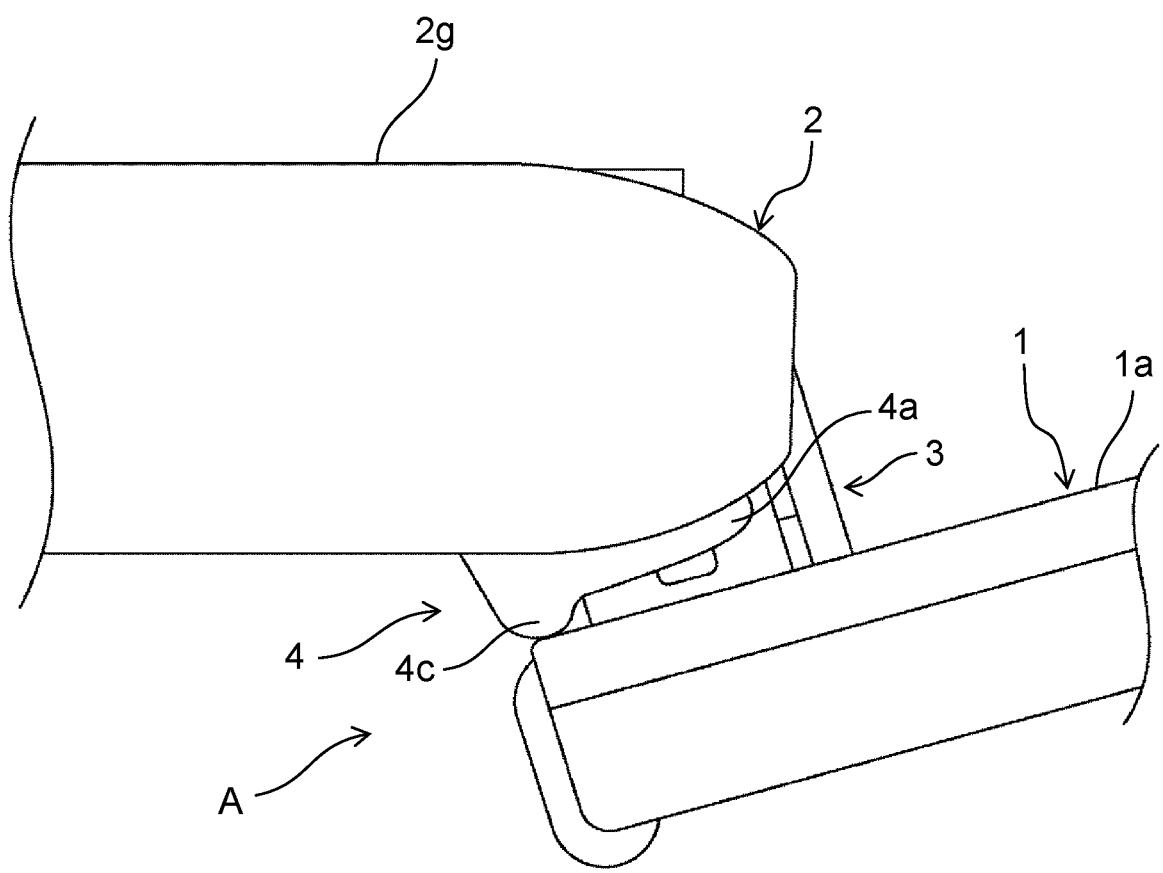
FIG. 2 is a side view of a vicinity of a foot member when the foot member is located at a closed position and rotation regulation is performed for a first housing is performed in a first rotation range with respect to a second housing.
Figure 4:
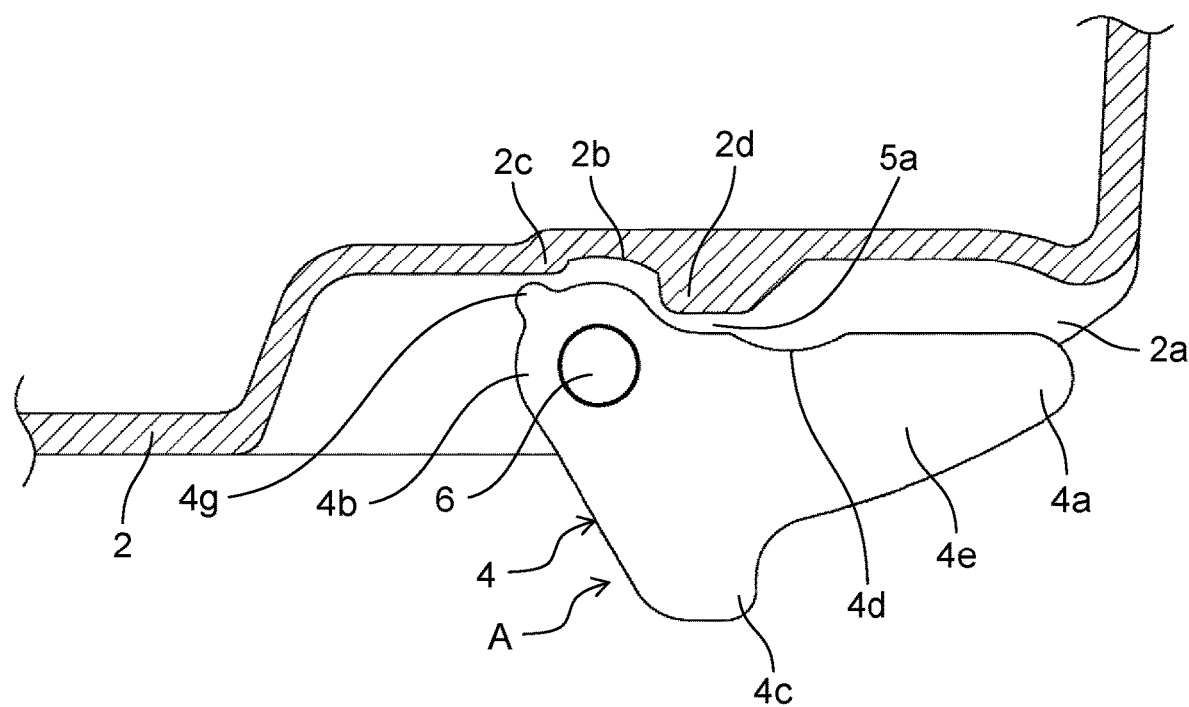
FIG. 4 is a cross-sectional view of the vicinity of the foot member being in the closed position.

As illustrated in FIGS. 2 and 4, closed position A is a position where the most part (for example, second protrusion 4e) enters housing recess 2a of second housing 2 and only a part (for example, first protrusion 4c) protrudes. Therefore, when first housing 1 opens to the first rotation range less than 180 degrees with respect to second housing 2, the end of first housing 1 on the rotation shaft portion side comes into contact with first protrusion 4c to regulate the rotation of first housing 1. At this closed position A, buffer gap 5a is provided between the inner surface of housing recess 2a and the opposing surface of foot member 4.

Figure 3:
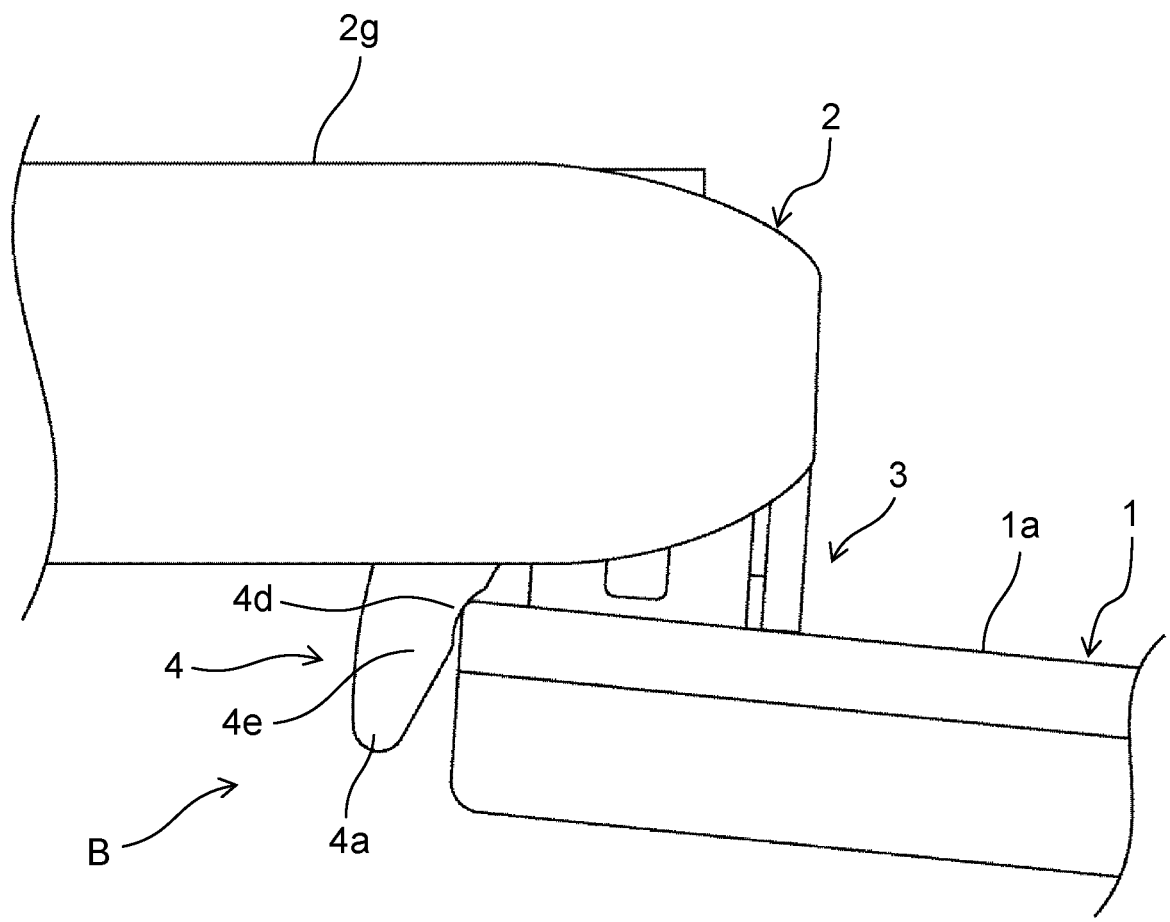
FIG. 3 is a side view of the vicinity of the foot member when the foot member is located at an opened position and rotation regulation for the first housing is performed in a second rotation range with respect to the second housing.
Figure 5:
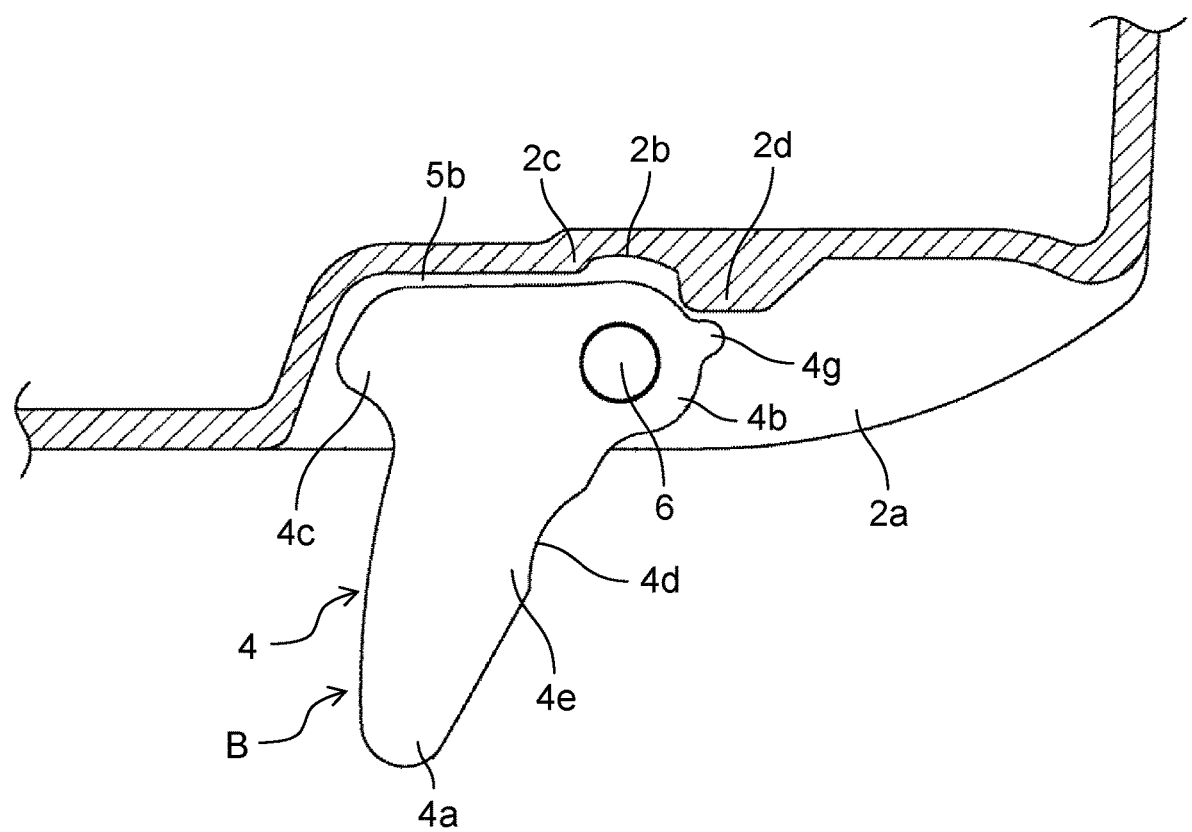
FIG. 5 is a cross-sectional view of the vicinity of the foot member being in the opened position.

As illustrated in FIGS. 3 and 5, opened position B is a position where a part (for example, first protrusion 4c) enters housing recess 2a of second housing 2 and most part (for example, second protrusion 4e) protrudes. Therefore, when first housing 1 opens with respect to second housing 2 greater than the first rotation range beyond 180 degrees to the second rotation range, the end of first housing 1 on the rotation shaft portion side comes into contact with rotation regulation recess 4d of second protrusion 4e to regulate the rotation of first housing 1. At this opened position B, buffer gap 5b is provided between the inner surface of housing recess 2a and the opposing surface of foot member 4.

Foot member 4 is positioned at closed position A or opened position B in housing recess 2a with a click feeling. Third protrusion 4g engageable with any one of first raised portion 2c, click feeling recess 2b, and second raised portion 2d of housing recess 2a and protruding in the radial direction of rotation shaft 6 is provided on the outer periphery of rotation shaft portion 4b of each foot member 4. When third protrusion 4g rides on and engages with first raised portion 2c, foot member 4 is positioned at closed position A as illustrated in FIG. 4. When third protrusion 4g engages with click feeling recess 2b, foot member 4 is movable freely between closed position A and opened position B. When third protrusion 4g rides on and engages with second raised portion 2d, foot member 4 is positioned at opened position B as illustrated in FIG. 5. When third protrusion 4g rides on and engages with first raised portion 2c or second raised portion 2d from the inside of click feeling recess 2b, the click feeling is obtained, so that the user can surely know that foot member 4 is positioned at closed position A or opened position B.

Foot pad 9 illustrated in FIG. 1 is a known thin disk-shaped rubber foot pad, functions as another contact portion that comes into contact with the surface of the desk together with contact portion 4a of foot member 4 when the electronic device is placed on the desk or the like, and has functions of preventing first housing 1 from being rubbed, preventing slippage, and adjusting the angle when first housing 1 is installed.

In the electronic device according to the above-described configuration, at closed position A illustrated in FIGS. 2 and 4, when first housing 1 opens with respect to second housing 2 less than 180 degrees within the first rotation range, the end of first housing 1 on the rotation shaft portion side comes into contact with first protrusion 4c protruding from housing recess 2a of second housing 2 to regulate the rotation of first housing 1. On the other hand, at opened position B illustrated in FIGS. 3 and 5, when first housing 1 opens with respect to second housing 2 more than or equal to 180 degrees to the second rotation range, the end of first housing 1 on the rotation shaft portion side comes into contact with rotation regulation recess 4d of second protrusion 4e protruding from housing recess 2a of second housing 2 to regulate the rotation of first housing 1.

According to the first exemplary embodiment, the rotation regulation with respect to first housing 1 can be performed by the portion other than the hinge, that is, foot member 4 protruding from the bottom face of second housing 2, and the structure can be simplified and the component cost can be reduced by eliminating the hinge stopper structure.

In addition, the rotation regulation of first housing 1 can be performed by bringing the elastic member, for example, rubber foot member 4 into contact with first housing 1, resulting in preventing damage due to interference between components and improving durability. That is, by using an elastic rubber material as a collision destination of first housing 1, it is possible to prevent first housing 1 from being scratched due to collision at the time of rotation regulation.

In addition, each of the foot members 4 can perform the rotation regulation of the first housing 1 in either closed position A or opened position B by coming into contact with the first housing 1, and can reliably perform the rotation regulation of first housing 1 regardless of the position of foot member 4.

Note that the present disclosure is not limited to the first exemplary embodiment, and can be implemented in various other modes.

For example, foot member 4 is not limited to being disposed near both ends in the width direction of the second housing, and may be disposed at one center in the width direction.

In addition, buffer gaps 5a and 5b are provided between the inner surface of housing recess 2a and the opposing surface of foot member 4, but a cushion material may be disposed in gaps 5a and 5b, and when first housing 1 comes into contact with foot member 4 and the rotation regulation is performed, an impact at the time of contact may be absorbed by the cushion material.

On the other hand, by eliminating this gap, the inner surface of housing recess 2a and the opposing surface of foot member 4 may be configured to be in contact with each other, and the force acting on foot member 4 at the time of contact with first housing 1 may be received on second housing 2 side to increase the rotation regulation force.

By appropriately combining discretionary exemplary embodiments or modifications among the various exemplary embodiments or modifications described above, it is possible to achieve the effect possessed by each of them. Combination of exemplary embodiments, combination of examples, or combination of exemplary embodiments and examples are possible, and combination of features in different exemplary embodiments or examples are also possible.

In the electronic device according to the above aspect of the present disclosure, when a housing on a display side such as a display is opened and closed with respect to a housing on an operation unit side such as a keyboard, rotation regulation can be performed for the housing on the display unit side by an elastic member on a bottom face of the housing on the operation unit side, and thus the electronic device is useful for an electronic device such as a personal computer.

What is claimed is:

1. An electronic device comprising:
    a first housing including a display;
    a second housing including an operation unit; and
    a rotation unit configured to connect the first housing to the second housing, and rotate the first housing relative to the second housing,
    wherein
    the second housing includes at least one rotation regulation portion that protrudes from a bottom face of the second housing and is configured to regulate rotation of the first housing with respect to the second housing,
    the at least one rotation regulation portion includes an elastic member configured to rotate back and forth between a first mode and a second mode with different states of protrusion from the bottom face of the second housing, the elastic member being contactable with the first housing, and
    the at least one rotation regulation portion is configured to, in the first mode, regulate rotation of the first housing with respect to the second housing in a first rotation range, and in the second mode, regulate rotation of the first housing with respect to the second housing in a second rotation range where the first housing is rotated with respect to the second housing to a greater extent than in the first rotation range.

2. The electronic device according to claim 1, wherein
    the at least one rotation regulation portion is partially housed in a housing recess of the bottom face of the second housing, and includes a first protrusion protruding from the housing recess of the second housing in the first mode, and
    the at least one rotation regulation portion is configured to, in the first mode, regulate rotation of the first housing by bringing the first protrusion protruding from the housing recess of the second housing into contact with the first housing.

3. The electronic device according to claim 1, wherein
    the at least one rotation regulation portion is partially housed in the housing recess of the bottom face of the second housing, and includes a second protrusion protruding from the housing recess of the second housing in the second mode, and a recess formed on an outer surface of the second protrusion, and
    the at least one rotation regulation portion is configured to, in the second mode, regulate rotation of the first housing by bringing the recess of the second protrusion protruding from the housing recess of the second housing into contact with the first housing.

4. The electronic device according to claim 1, wherein
    the at least one rotation regulation portion is partially housed in the housing recess of the bottom face of the second housing, and includes a first protrusion protruding from the housing recess of the second housing in the first mode, a second protrusion protruding from the housing recess of the second housing in the second mode, and a recess formed on an outer surface of the second protrusion,
    the at least one rotation regulation portion
        is configured to, in the first mode, regulate rotation of the first housing by bringing the first protrusion protruding from the housing recess of the second housing into contact with the first housing
        is configured to in the second mode, regulate rotation of the first housing by bringing the recess of the second protrusion protruding from the housing recess of the second housing into contact with the first housing, and
        includes a protrusion dimension of the second protrusion larger than a protrusion dimension of the first protrusion from the housing recess of the second housing.

5. The electronic device according to claim 1, wherein the at least one rotation regulation portion is partially stored in a housing recess of the bottom face of the second housing, and a buffer gap is provided between an inner surface of the housing recess and an opposing surface of the at least one rotation regulation portion.

6. The electronic device according to claim 1, wherein the at least one rotation regulation portion is two rotation regulation portions, and is disposed near both ends of the second housing in a width direction along a rotation axis direction of the rotation unit for rotating the first housing or the second housing.

7. The electronic device according to claim 1, wherein the at least one rotation regulation portion is a foot member for slippage prevention on a bottom face of the second housing.

* * * * *